US012736561B2

(12) United States Patent
Okuma

(10) Patent No.: US 12,736,561 B2
(45) Date of Patent: Sep. 15, 2026

(54) PROBE PIN AND PROBE CARD

(71) Applicant: JAPAN ELECTRONIC MATERIALS CORPORATION, Amagasaki (JP)

(72) Inventor: Koki Okuma, Amagasaki (JP)

(73) Assignee: JAPAN ELECTRONIC MATERIALS CORPORATION, Amagasaki (JP)

( * ) Notice: Subject to any disclaimer, the term of this patent is extended or adjusted under 35 U.S.C. 154(b) by 231 days.

(21) Appl. No.: 18/578,963

(22) PCT Filed: Feb. 20, 2023

(86) PCT No.: PCT/JP2023/005990
§ 371 (c)(1),
(2) Date: Jan. 12, 2024

(87) PCT Pub. No.: WO2023/188999
PCT Pub. Date: Oct. 5, 2023

(65) Prior Publication Data

US 2025/0052784 A1 Feb. 13, 2025

(30) Foreign Application Priority Data

Mar. 31, 2022 (WO) .................. PCT/JP2022/016805

(51) Int. Cl.
*G01R 1/067* (2006.01)
*G01R 1/073* (2006.01)
*G01R 31/28* (2006.01)

(52) U.S. Cl.
CPC ..... *G01R 1/06761* (2013.01); *G01R 1/06733* (2013.01); *G01R 1/07342* (2013.01); *G01R 31/2886* (2013.01)

(58) Field of Classification Search
CPC .......... G01R 1/067–07392; G01R 31/28–2898
See application file for complete search history.

(56) References Cited

U.S. PATENT DOCUMENTS

| | | | | |
|---|---|---|---|---|
| 11,408,914 | B2 * | 8/2022 | Park | G01R 1/06716 |
| 2012/0242363 | A1 | 9/2012 | Breinlinger et al. | |
| 2024/0103040 | A1 * | 3/2024 | Frodis | G01R 1/06744 |

FOREIGN PATENT DOCUMENTS

JP 5995953 B2 9/2016

OTHER PUBLICATIONS

International Search Report (PCT/ISA/210) with translation and Written Opinion (PCT/ISA/237) mailed on May 16, 2023, by the Japan Patent Office as the International Searching Authority for International Application No. PCT/JP2023/005990. (11 pages).

* cited by examiner

*Primary Examiner* — Lee E Rodak
*Assistant Examiner* — Jeremiah J Barron
(74) *Attorney, Agent, or Firm* — Buchanan Ingersoll & Rooney PC

(57) ABSTRACT

A probe pin includes a low resistance member consisting of a first metal with a first conductivity, and a high resistance member consisting of a second metal with a second conductivity, the second metal having a resistivity higher than that of the low resistance member. The probe pin has a multi layered part between a contact part and a terminal part, where the multi layered part is configured in the order of the high resistance member, a slit of air gap, and the low resistance member, in a first direction different from a buckling direction of the probe pin at the time of inspection of a test object. The low resistance member and the high resistance member are arranged so as not to overlap with each other, when the multi layered part is viewed from the buckling direction.

12 Claims, 8 Drawing Sheets

20t
20U
11H
11
20
20m
Z
12H
20D
12
20c
T1
A1
B1
L
C
S
H
T3
T5
20m
B2
A2
Y
H
L
S

H
L
S
Y
Z
11H
12H
20m
20t
20c
220
220U
220D
11
12
T5
T1
E1
E2
F
D

H
L
S
Y
Z

11H
H
E1
Br
20m
T5
F
G
L
12H
E2
D
T1
20t
220U
11
420
S
Y
12
220D
20c

L
Y
Z

L
H
Y
Z

L
H
S
L
Y
Z

11H
L
T505
20m
H
12H
T1
E1
F
L
E2
D
20t
220U
11
E11
F
520
S
Y
E21
D
12
220D
20c

H
Z

H
Y
Z

L
S
Y
Z
H

11H
H
T603
620m
L
H
12H
T1
E1
E1
F
F
E2
E2
20t
220U
11
620
S
Y
12
220D
20c

PROBE PIN AND PROBE CARD

TECHNICAL FIELD

The present disclosure relates to the field of a probe pin and a probe card.

BACKGROUND ART

Probe cards are cards (substrates) to which probe pins (pointed probes) are attached. On a semiconductor wafer, electronic circuits of a semiconductor device are formed. The probe card connects each of the electrodes of such electronic circuits (electric power input electrodes, signal output electrodes, and earth electrodes) to a testing device, by the use of probe pins.

When electrical properties of the electronic circuit of a semiconductor device are inspected, current is supplied to a semiconductor device, to operate the semiconductor device. The electronic circuit is then checked whether the semiconductor device outputs a predetermined signal or not. In this inspection, a large current flows into a probe pin for suppling electric power source (electric power pin) and a ground probe pin for grounding (ground pin).

When a large current flows through the electric power pin and the ground pin at the time of inspection of a semiconductor device, a problem may be caused that the probe pin is burned out. Therefore, a probe pin with a high allowable current value is desired.

In order to enhance the allowable current value, while preserving the mechanical strength of a probe pin, a current path is proposed in which a high resistance conductor and a low resistance conductor are arranged side by side (refer to the Patent Document 1). In this configuration, the high resistance conductor helps in preserving the mechanical strength of a probe pin, and the low resistance conductor flows a large current.

CITATION LIST

Patent Literature

Patent Document 1: Japanese Patent No. 5995953

SUMMARY OF THE INVENTION

Technical Problem

Like the probe pin which is shown in the Patent Document 1, there is a case where a plurality of conductors, each having a different resistivity, are arranged side by side, having a space in between. Even in such a case, however, a low resistance conductor generates heat to expand and contacts with a high resistance conductor. Heat is transferred to the high resistance conductor, and thereby, a problem may be caused that the mechanical strength is decreased.

Moreover, in the case of a probe pin which is arranged perpendicularly, a probe card is pushed down against a semiconductor wafer, until the probe pin carries out buckling, in order to ensure the contact of the probe pin with the electrode of an electronic circuit. For this reason, when conductors each having a different electric conduction rate are aligned in the buckling direction, a problem may be caused that those conductors come into contact with each other, due to thermal expansion and the displacement by buckling.

The present disclosure discloses the technology for solving the subjects mentioned above, and aims at achieving a probe pin and a probe card which enable the preservation of mechanical strength and a high allowable current value.

Solution to Problem

The present disclosure discloses a probe pin, which has a contact part at one end of a longitudinal direction, for contacting an electrode of a test object, and has a terminal part at the other end of the longitudinal direction, for contacting a circuit board. The probe pin includes:

a low resistance member consisting of a first metal with a first conductivity, and a high resistance member consisting of a second metal with a second conductivity, the second metal having a resistivity higher than that of the low resistance member, wherein the probe pin has a multi layered part between the contact part and the terminal part, where the multi layered part is configured in an order of the high resistance member, a slit of air gap, and the low resistance member, in a first direction different from a buckling direction of the probe pin at the time of inspection of the test object, and the low resistance member and the high resistance member are arranged so as not to overlap with each other, when the multi layered part is viewed from the buckling direction.

Advantageous Effects of the Invention

According to the probe pin and the probe card which are disclosed in the present disclosure, it becomes possible to achieve the probe pin and the probe card which enable the preservation of mechanical strength and a high allowable current value.

BRIEF EXPLANATION OF THE DRAWINGS

FIG. 41) is a cross sectional view of FIG. 4B taken along the line E1-E1, and taken along the line E2-E2.

FIG. 71D is a cross sectional view of FIG. 7B taken along the line E1-E1, and taken along the line E2-E2.

DESCRIPTION OF EMBODIMENTS

Embodiment 1

Figure 1:
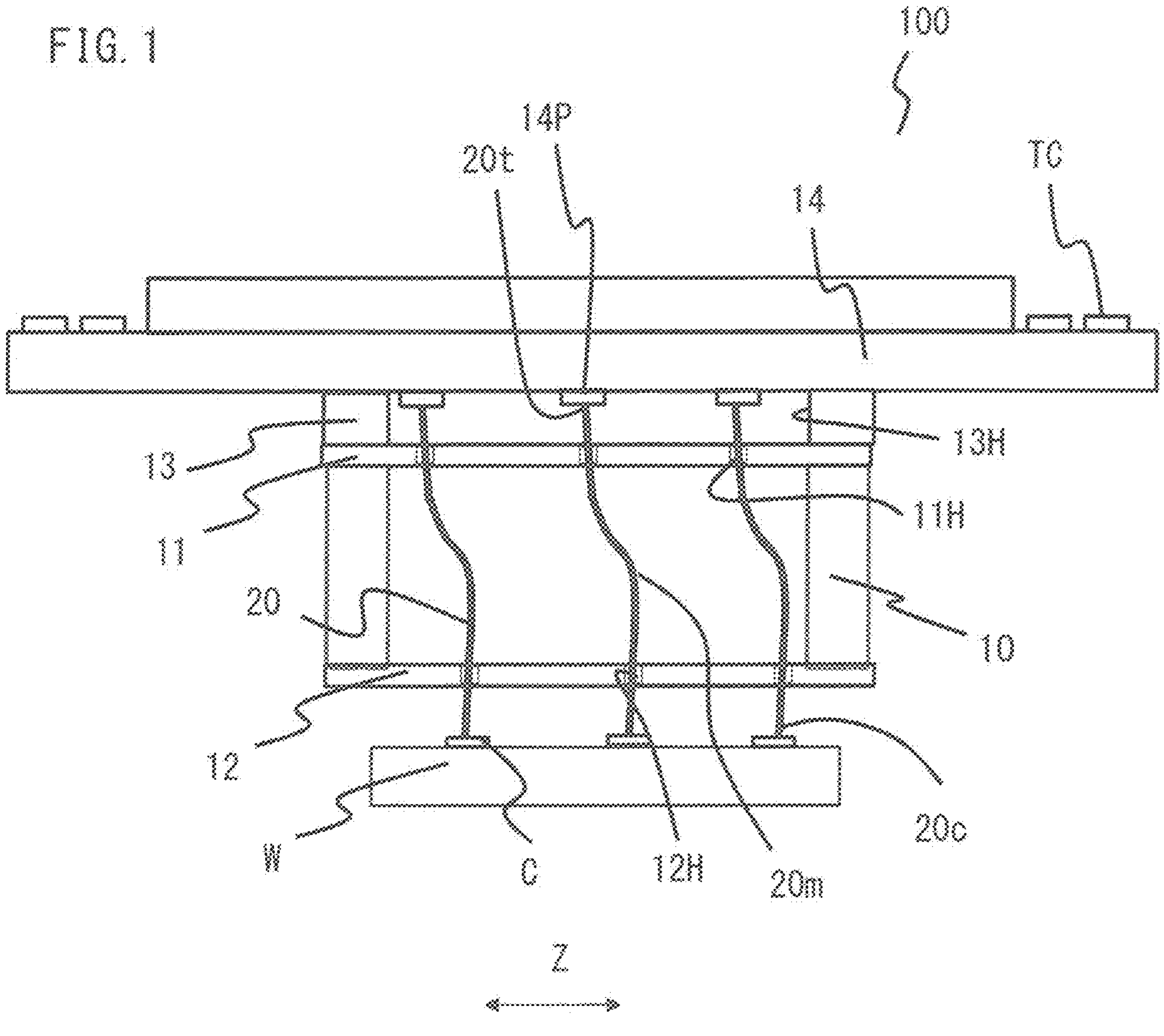
FIG. 1 is a diagram showing schematically the state of inspection of an electronic circuit, by the use of a probe card in accordance with the Embodiment 1.

Hereinafter, explanations will be made concerning a probe pin and a probe card in accordance with the Embodiment 1, with reference to drawings. FIG. 1 is a diagram showing schematically the state of inspection of an electronic circuit, by the use of the probe card 100 in accordance with the Embodiment 1.

In the present specification, the upper side of the page of FIG. 1 will be described as "up", and the lower side of the page will be described as "low". That is, when viewed from the probe card 100, a test object side is referred to as "low". Moreover, the left and right direction of the page of FIG. 1 is set to be a buckling direction Z, for convenience. The direction which goes from the front side of the page to the back side, and its reverse direction are, for convenience, set to be a direction Y (first direction), which is perpendicular to the buckling direction Z.

The probe card 100 is an apparatus which will be used to inspect electrical properties of the electronic circuit of a semiconductor device, which is formed on a semiconductor wafer W. The probe card 100 is equipped with a large number of probe pins 20, each of which will have a direct contact with the corresponding electrode C, which is on the electronic circuit of the semiconductor device, formed on the semiconductor wafer W. When the characteristic inspection of an electronic circuit is carried out, the semiconductor wafer W is brought closer to the probe card 100, to make the tip of a probe pin 20 contact with the electrode C on the electronic circuit. Thus, a testing device, not illustrated, and tester connection electrodes TC of the wiring substrate 14 of the probe card 100 will produce electrical connections through the probe pin 20.

The probe card 100 is equipped with a hollow frame 10, an upper guide 11 which is attached to the upper end of the frame 10, a lower guide 12 which is attached to the lower end of the frame 10, a fixing board 13 which fixes the upper guide 11, and a wiring substrate 14. In some embodiments, an intermediate guide may be further provided between the upper guide 11 and the lower guide 12.

The upper guide 11 has a plurality of guide holes 11H penetrating in the up and down direction. The lower guide 12, which is provided under the upper guide 11, has also a plurality of guide holes 1211 penetrating in the up and down direction. And the portion above the guide holes 11H becomes an opening part 13H which is provided in the fixing board 13. The wiring substrate 14 is arranged on the upper surface of the fixing board 13. The wiring substrate 14 has a plurality of probe connection pads 14P on its lower surface. Each of the probe connection pads 14 is in contact with a terminal part 20*t* of the upper end of a probe pin 20.

And, a plurality of probe pins 20 are inserted and guided, so that each of the probe pins are able to pass through the inside of a guide hole 12H and a guide hole 11H. The probe pin 20 is a perpendicular type probe pin, which will be arranged perpendicularly to a test object (electronic circuit which is formed on a semiconductor wafer W).

Figures 2A, 2B, 2C, 2D, 2E:
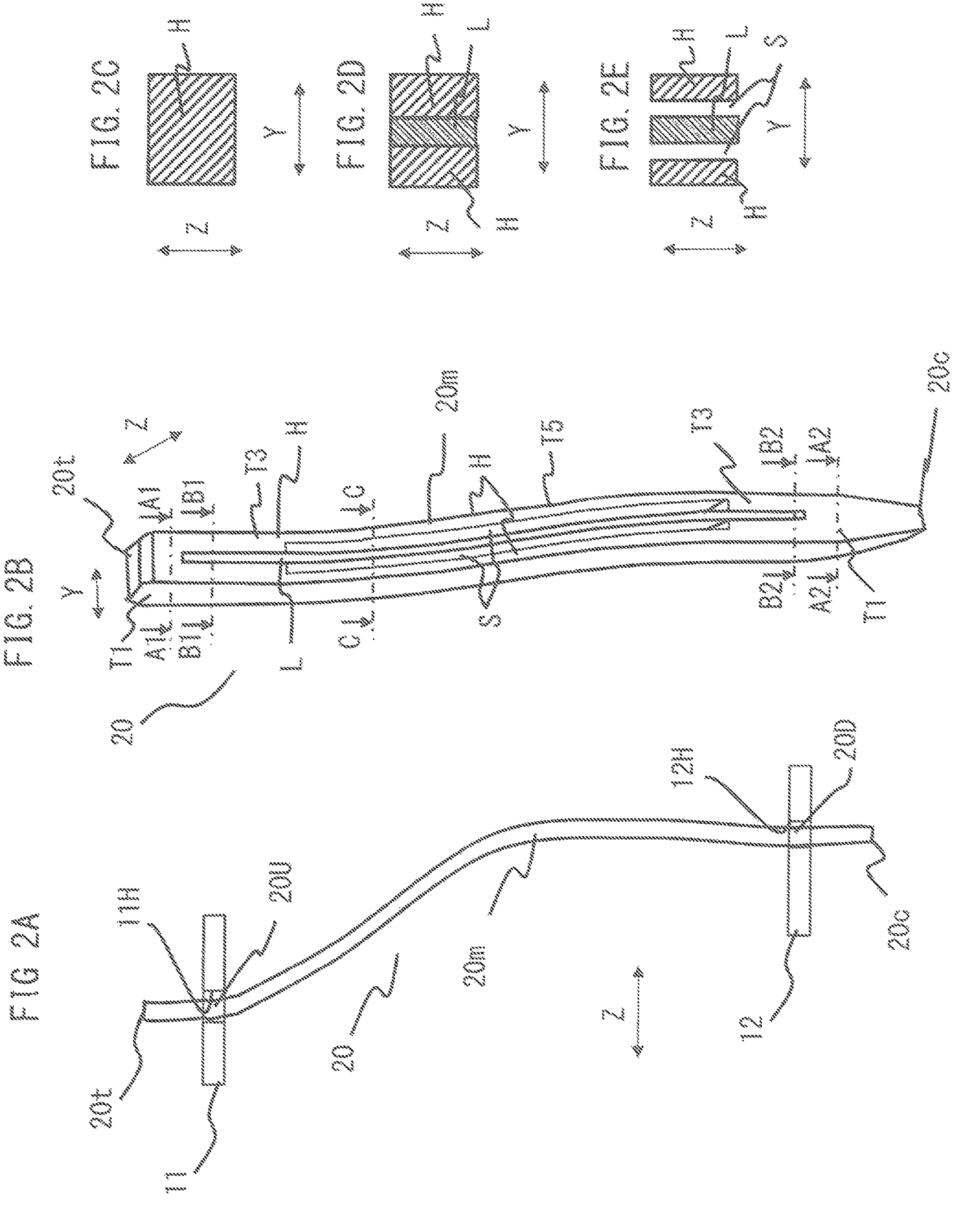
FIG. 2A is an enlarged view of the main part of FIG. 1.
FIG. 2B is a perspective view of a probe pin.
FIG. 2C is a cross sectional view of FIG. 2B taken along the line A1-A1, and taken along the line A2-A2.
FIG. 2D is a cross sectional view of FIG. 2B taken along the line B1-B1, and taken along the line B2-B2.
FIG. 2E is a cross sectional view of FIG. 2B taken along the line C-C.

FIG. 2A is an enlarged view of the main pan of FIG. 1. One probe pin 20, the upper guide 11 and the lower guide 12 are illustrated. The left and right direction of FIG. 2A indicates the buckling direction Z of the probe pin 20, that is, a direction to which the probe pin 20 deforms elastically at the time of an overdrive of the probe card 100, FIG. 2B is a perspective view of the probe pin 20. The direction Y, shown in the drawing, is a direction perpendicular to the buckling direction Z.

The probe pin 20 has a long and thin form. Its central part is curved, and its upper part and its lower part are prolonged linearly in the up and down direction. The curved central part is an elastic deformation part 20*m*. The probe pin 20 is equipped with a contact part 20*c*, at the lower end (one end). And, the terminal part 20*t* is formed at the upper end (the other end).

The contact part 20*c* is a contact part which will be contacted to a test object. Moreover, the terminal part 201 is provided at the upper end part of the probe pin 20, and will be press contacted to the probe connection pad 14P of the wiring substrate 14, at the time of an inspection. The elastic deformation part 20*m* is a portion which is likely to buckle and deform, when a compressive force is applied in the longitudinal direction at the time of an overdrive. According to the reaction force from a test object at the time of the overdrive, the elastic deformation part 20*m* buckles and deforms in the buckling direction Z, and the contact part 20*c* retreats toward the terminal part 20*t* side.

A predetermined range of the portion which is above the elastic deformation part 20*m* is an upper guide-inside storage part 20U. This portion is stored inside the guide hole 11H of the upper guide 11. Moreover, a predetermined range of the portion which is below the elastic deformation part 20*m* is an lower guide-inside storage part 20D. This portion is stored inside the guide hole 12H of the lower guide 12.

The probe pin 20 is composed of two kinds of metals which have conductivity and are different in resistivity. One is a metal t first metal j which constitutes a low resistance member L, consisting of low resistivity metal, such as copper, gold, and silver (Cu, Au, and Ag). The other is a metal (second metal) which constitutes a high resistance member H, such as palladium alloy. The high resistance member H is higher in resistivity, and lower in conductivity, but higher in mechanical strength, than the low resistance member L. The low resistance member L is high in conductivity, and serves a function in enhancing the high allowable current value. The high resistance member H serves a function in preserving the mechanical strength.

And, a large amount of current flows into a low resistance portion, and the flow rate of current is small in the high resistance member H. Then, heat generation in the high resistance member H is less than that in the low resistance member L. As for the resistivity, palladium alloy is 35.8 μΩ-m or so, and on the other hand, gold is 3 μΩ-m or so. If cross sectional areas are the same in both metals, the calorific value of the low resistance member L will become twelve times as large as the calorific value of the high resistance member H.

FIG. 2C is a cross sectional view of FIG. 2B taken along the line A1-A1, and taken along the line A2-A2, and is a cross sectional view of the single layered part T1 of a probe pin 20, where the view is perpendicular to the longitudinal direction.

FIG. 2D is a cross sectional view of FIG. 2B taken along the line B1-B1, and taken along the line B2-B2, and is a cross sectional view of a three layered part 13 of a probe pin 20, where the view is perpendicular to the longitudinal direction.

FIG. 2E is a cross sectional view of FIG. 2B taken along the line C-C, and is a cross sectional view of the five layered part T5 (multi layered part) of a probe pin 20, where the view is perpendicular to the longitudinal direction.

The probe pin 20 includes portions arranged in the longitudinal direction, each of which is different in the arrangement of the low resistance member L and the high resistance member H, which are mentioned above. The upper end part containing the terminal part 20*t* and the lower end part containing the contact part 20*c* are single layered parts T1, which consist only of a single layer of the high resistance member H. It is worth noticing that, the number of "layers" denotes the layer number of substances which constitute the probe pin 20, in the direction Y perpendicular to the buckling direction Z. and an air gap (gas) will also be contained in the layers. In the section of FIG. 2C, the single layered part T1 consists only of a single layer of the high resistance member H, in the direction Y which is perpendicular to the buckling direction Z.

At the time of an inspection, the terminal part 20*t* repeats a press contacting to the probe connection pad 14P of the wiring substrate 14, and the contact part 20*c* repeats a press contacting to the electrode C on the electronic circuit which is formed on a semiconductor wafer W. So these parts are required of mechanical strength, and then, consist only of the high resistance member H having high mechanical strength.

The upper end part of the probe pin 20 and the lower end part consist only of a high resistance member H, as mentioned above. The portion below the upper end part and the portion above the lower end part are three layered parts T3, each of which is equipped with two high resistance members H. Such high resistance members are arranged at the both out sides of the three layered part, layered in the direction Y which is perpendicular to the buckling direction Z. The three layered part includes a low resistance member L, which is caught between the two high resistance members H concerned. In the section of FIG. 2D, the three layered part T3 is constituted of three layers, that is, a high resistance member H, a low resistance member L, and a high resistance member H, which are arranged in the direction Y, perpendicular to the buckling direction Z. Although the three layered part is separated in the direction Y to have three layers, each of the adjoining layers are adhered with each other. A part of the upper three layered part T3 becomes the upper guide-inside storage part 20U which is mentioned above, and a part of the lower three layered part T3 becomes the lower guide-inside storage part 200.

The portion corresponding to the elastic deformation part 20*m* is a five layered part T5, which is formed between the two three layered parts 13, where one is provided at the upper side of the probe pin and the other is at the lower side. The five layered part is equipped with two high resistance members H at the both out sides of the five layered part, layered in the direction Y, which is perpendicular to the buckling direction Z. A low resistance member L is caught between the two concerned high resistance members H, via a slit S. Both of the slits penetrate in the member's both sides of the buckling direction Z, in the section of FIG. 2E, the five layered part T5 is constituted of five layers, that is, a first high resistance member H, a first slit S of air space, a low resistance member L, a second slit of air space, and a second high resistance member H, which are all arranged in the direction Y perpendicular to the buckling direction Z.

As shown in FIG. 2B, the high resistance member H of the probe pin 20 is bifurcated from the upper end part of the probe pin 20 toward the downward region, and becomes one piece again, at the lower end part. Moreover, the low resistance member L of the upper three layered part T3, the low resistance member L of the five layered part T5, and the low resistance member L of the lower three layered part T13 are connected altogether. And the cross section of the low resistance member L perpendicular to the longitudinal direction is plate rectangle.

At the time of an inspection, the low resistance member L generates twelve times more heat than the high resistance member H. The three layered parts T3 include, as their part, the upper guide-inside storage part 20U and the lower guide-inside storage part 20D. The upper guide-inside storage part 20U and the lower guide-inside storage part 20D are stored in the guide hole 11H of the upper guide 11 and in the guide hole 12H of the lower guide 12, respectively. The outer periphery of the upper guide-inside storage part 20U contacts with the upper guide 11, and that of the lower guide-inside storage part 20) contacts with the lower guide 12. In the contact portions, heat which is conducted from the low resistance member L to the high resistance member H is radiated by the upper guide 11 and the lower guide 12, and then, the high resistance member H is not damaged by heat. It is worth noticing that, the range of the heat dissipation effect which is produced by the upper guide 11 and the lower guide 12 is in the range of 500 μm to 1000 μm, from the upper guide 11 and the lower guide 12, respectively. Therefore, the length of the three layered part T3 which covers from the upper guide 11 to the five layered part T5, or from the lower guide 12 to the five layered part T5 may be set in the range of 500 μm to 1000 μm.

On the other hand, the elastic deformation part 20*m* is away from the upper guide 11 and the lower guide 12. When the elastic deformation part has the same configuration as the three layered part T3, heat generated in the low resistance member L, may conduct to the high resistance member H, and then, it is probable that the reduction in strength may be caused in the high resistance member H. Therefore, a slit S is provided between the low resistance member L and the high resistance member H, to radiate the heat which is generated in the low resistance member L. At the same time, the slit prevents the high heat of the low resistance member L from conducting directly to the high resistance member H. Thus, the reduction in mechanical strength of the high resistance member H is prevented.

In the characteristic inspection of an electronic circuit, a probe pin buckles in the buckling direction at the time of an overdrive. At this time, the low resistance member becomes much higher in temperature than the high resistance member, and then, expands more than the high resistance member. Like in the Patent Document 1 which is cited as a prior art reference, there is a case where a high resistance member and a low resistance member are arranged side by side, via a slit penetrating both sides in a direction perpendicular to the buckling direction. In this case, due to the difference in the expansion rate between a high resistance member and a low resistance member, and the modification by buckling, the low resistance member at a high temperature comes into contact with the high resistance member, which is adjoining in the buckling direction, and high heat produced in the low resistance member will conduct to the high resistance member. Due to the heat conduction, the high resistance member deforms plastically, and there arises a problem that the stylus pressure at a contact part to the electrode of an electronic circuit falls.

However, according to the present Embodiment 1, the high resistance member H and the low resistance member L are arranged in the direction Y which is perpendicular to the buckling direction Z, via the slit S which penetrates in the buckling direction Z. In this case, the low resistance member L and the high resistance members H at its both out sides, which are adjoining with each other via a slit S, do not come to contact, even if their expansion rates are different. Then, the problem mentioned above does not occur. In other words, when the multi layered part made up of a low resistance member L and a high resistance member H is viewed from the buckling direction, the low resistance member L and the high resistance member H are arranged so that the both members may not overlap with each other. Thereby, the contact between the low resistance member L and the high resistance members HI does not take place, and no problems are caused, even if thermal expansion and modification by buckling are generated.

Figure 3:
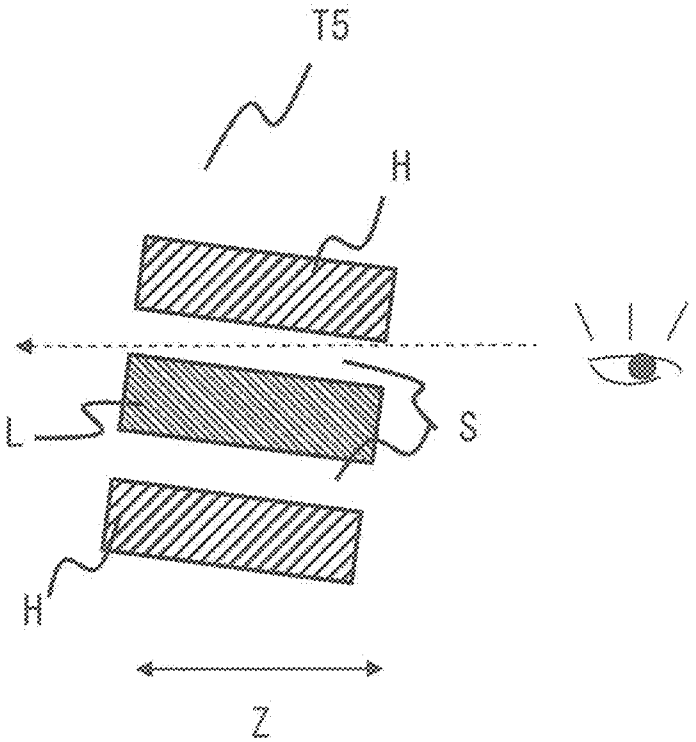
FIG. 3 is a diagram showing the acceptable range in the arrangement of a five layered part, in accordance with the Embodiment 1.

FIG. 3 is a diagram showing the design acceptable range in the arrangement of a five layered part T5.

In each of the drawings used for the explanations so far, descriptions are given that, in the five layered part T5, a low resistance member L high resistance members H, and slits S, are aligned in the direction Y perpendicular to the buckling direction Z. The first direction is however a direction different from the buckling direction Z, and as is shown in FIG. 3, it is required that the low resistance member L and the high resistance members H do not overlap with each other, when the five layered part T5 of the probe pin 20 is viewed from the buckling direction. Even in this case, the contact between the low resistance member L and the high resistance members H do not contact with each other, even if there is thermal expansion and modification by buckling.

The probe pin 20 is produced using what is called MEMS (Micro Electro Mechanical Systems) technology. The MEMS technology is a technology which creates fine three dimensional structures, using photolithographic technology and sacrifice layer etching technology. The photolithographic technology is a processing technology of fine patterns, employing photoresists used in a semiconductor manufacturing process and the like. Moreover, the sacrifice layer etching technology is a technology which creates three dimensional structures, where a lower layer called a sacrifice layer is formed, and a layer for constituting a structure is formed on it, and then, only the sacrifice layer is removed by etching.

Well known plating technologies can be used for the formation processing of each of a plurality of layers, containing a sacrifice layer. For example, a substrate as a negative pole, and a metal piece as an anode are dipped in an electrolysis solution. When a voltage is applied between both electrodes, metal ions in the electrolysis solution will adhere on the surface of the substrate. Such processing is called an electroplating processing, and is a wet process to dip a substrate in an electrolysis solution. Then, dry processing will be conducted after the plating processing is finished.

According to the probe pin 20 and the probe card 100 in accordance with the Embodiment 1, the low resistance member L, and the high resistance members H at its both sides, which are adjoining via a slit S of the probe pin 20, are not aligned in the buckling direction Z, at the time of inspection of the electronic circuit which is formed on a semiconductor wafer W. Those members then do not come to contact with each other, even if there is thermal expansion and modification by buckling. Therefore, it becomes possible to achieve a probe pin and a probe card with enhanced heat dissipation and a high allowable current value, where the high heat of the low resistance member L does not conduct to the high resistance member H.

Embodiment 2

Hereinafter, explanations will be made concerning the probe pin and probe card in accordance with the Embodiment 2, focusing on portions which are different from the Embodiment 1.

Figures 4A, 4B, 4C, 4D, 4E:
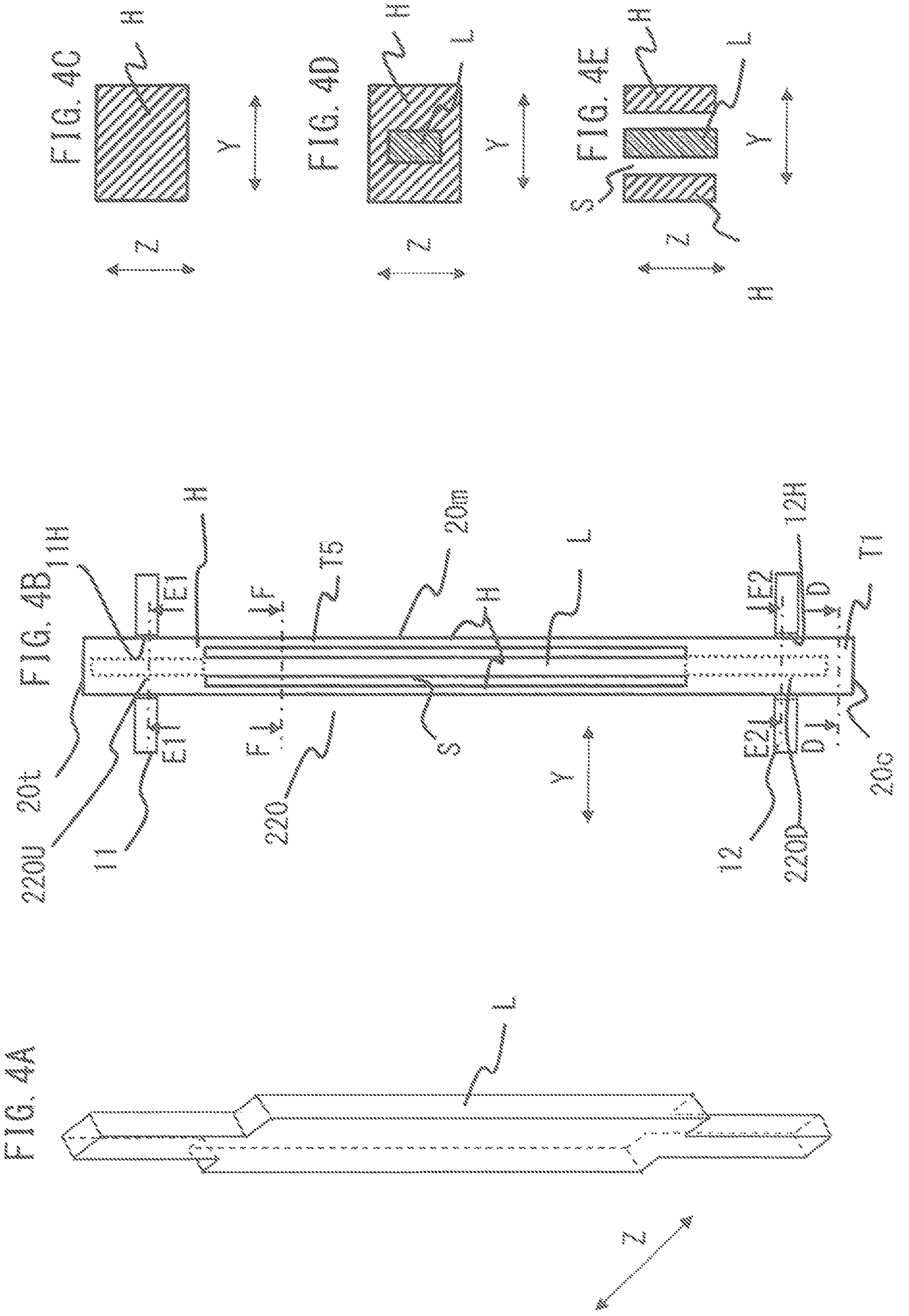
FIG. 4A is a diagram showing the configuration of the low resistance member of a probe pin in accordance with the Embodiment 2.
FIG. 4B is a diagram showing the probe pin in accordance with the Embodiment 2, where the probe pin is viewed from a buckling direction Z.
FIG. 4C: is a cross sectional view of FIG. 4B taken along the line D-D.
FIG. 4E is a cross sectional view of FIG. 4B taken along the line F-F.

FIG. 4A is a diagram showing the configuration of the low resistance member L of a probe pin 220.

FIG. 4B is a diagram of the probe pin 220, which is viewed from the buckling direction Z, shown in FIG. 4A.

FIG. 4C is a cross sectional view of FIG. 4B taken along the line D-D, and is a cross sectional view of a single layered part T1 of the probe pin 220, where the view is perpendicular to the longitudinal direction. The cross sectional shape of this portion is the same as that of the Embodiment 1.

FIG. 4D is a cross sectional view of FIG. 413 taken along the line E1-E1, and taken along the line E2-E2, and is a cross sectional view of the upper guide-inside storage part 2201 of the probe pin 220 and that of the lower guide-inside storage part 220D, where the view is perpendicular to the longitudinal direction. The cross sectional shape of this portion is different from that of the Embodiment 1. The cross sectional shape of the portion corresponding to the three layered part T3 of the Embodiment 1 is FIG. 4D.

FIG. 4E is a cross sectional view of FIG. 4B taken along the line F-F, and is a cross sectional view of the five layered part T5 of the probe pin 220, where the view is perpendicular to the longitudinal direction. The cross sectional shape of this portion is the same as that of the Embodiment 1.

As shown in FIG. 4A, the width in the buckling direction Z of the low resistance member L, becomes narrower above and below the live layered part T5. And at those portions concerned, the low resistance member L is embedded in the high resistance member H. That is, the circumference of the outer periphery of the low resistance member L is entirely covered with the high resistance member H.

According to the probe pin 220 and the probe card 100 in accordance with the Embodiment 2, the same effect as the Embodiment 1 will be produced, at the time of inspection of an electronic circuit which is formed on a semiconductor wafer W. Moreover, in the probe pin 220, the upper guide-inside storage part 220U in contact with the upper guide 11 and the lower guide-inside storage part 220D in contact with the lower guide 12 have their own outer peripheries. The circumference of such outer peripheries is entirely covered with the high resistance member H which is harder than the low resistance member L, and then, it becomes possible to achieve a more durable probe pin 220 and probe card 100.

Embodiment 3

Hereinafter, explanations will be made concerning the probe pin and the probe card in accordance with the Embodiment 3, focusing on portions which are different from the Embodiment 1 and the Embodiment 2.

Figure 5:
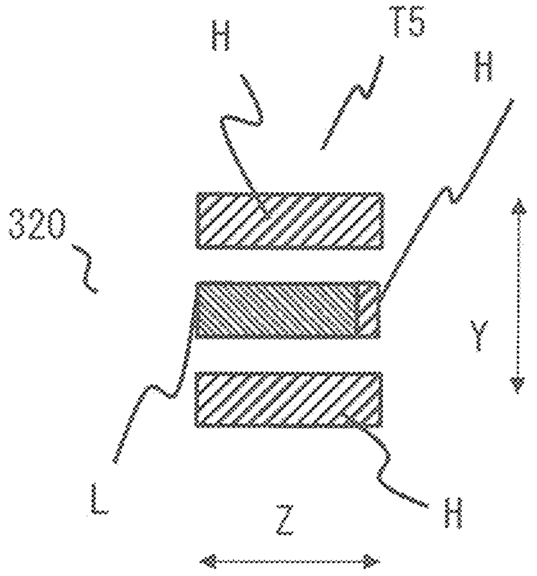
FIG. 5 is a cross sectional view of the five layered part of a probe pin in accordance with the Embodiment 3, where the view is perpendicular to the longitudinal direction.

FIG. 5 is a cross sectional view of the five layered part T5 of a probe pin 320, where the view is perpendicular to the longitudinal direction.

As mentioned above, the low resistance member L and the high resistance member H have different expansion rates at the time of an inspection. The low resistance member L, which becomes higher in temperature, expands more than the high resistance member H, and will also have a larger amount of buckling. So, in the present Embodiment 3, a thin plate like high resistance member H is provided also at the end face in the buckling direction Z of the low resistance member L of the five layered part T5. The plate may reduce the difference in the expansion rate. Thereby, the difference in the expansion rate between the low resistance member L and the high resistance member H can exert an inhibitory influence on the stylus pressure of the probe pin 320.

According to the probe pin 320 and probe card 100 in accordance with the Embodiment 3, the same effect as the Embodiment 1 will be produced, at the time of inspection of an electronic circuit which is formed on the semiconductor wafer W. Moreover, the low resistance member L of the five layered part T5 becomes adjustable in the expansion rate, and the stylus pressure of the probe pin 320 can be stabilized. Then, it becomes possible to achieve a more reliable probe pin 320 and probe card 100.

Embodiment 4

Hereinafter, explanations will be made concerning the probe pin and probe card in accordance with the Embodiment 4, focusing on portions which are different from the Embodiments 1-3.

Figure 6B:
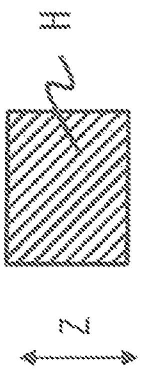
FIG. 6B is a cross sectional view of FIG. 6A taken along the line D-D.
Figure 6C:
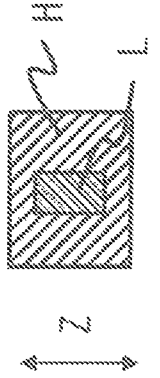
FIG. 6C is a cross sectional view of FIG. 6A taken along the line E1-E1, taken along the line 12-12, and taken along the line G-G.
Figure 6D:
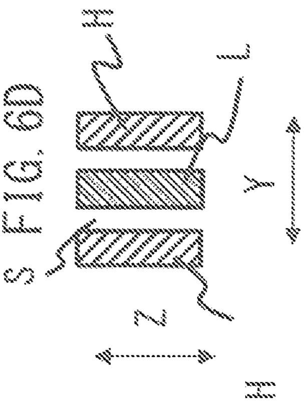
FIG. 6D is a cross sectional view of FIG. 6A taken along the line F-F.
Figure 6A:
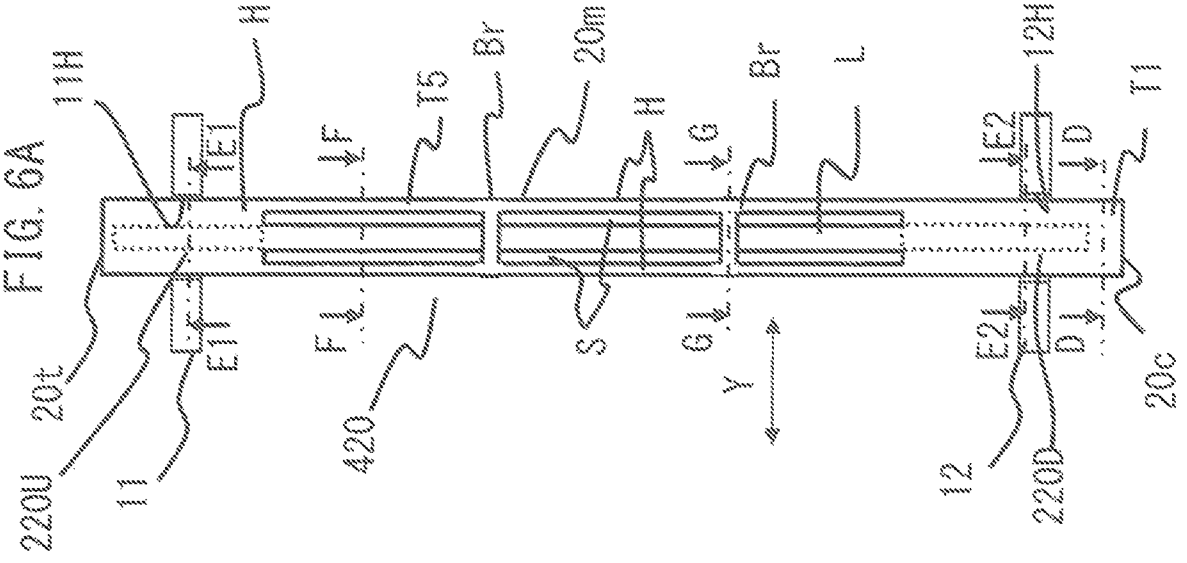
FIG. 6A is a diagram showing the probe pin in accordance with the Embodiment 4, where the probe pin is viewed from a buckling direction Z.

FIG. 6A is a diagram of a probe pin 420 which is viewed from the buckling direction Z.

FIG. 6B is a cross sectional view of the probe pin 420 of FIG. 6A taken along the line D-D, and shows the section of the single layered part T1 of the probe pin 420, where the section is perpendicular to the longitudinal direction. The cross sectional shape of this portion is the same as those of the Embodiments 1-3.

FIG. 6C is a cross sectional view of FIG. 6A taken along the line E1-E1, taken along the line E2-E2, and taken along the line G-G, and shows a section of the upper guide-inside storage part 220U of the probe pin 420, that of the lower guide-inside storage part 220D, and that of the bridge part Br, where the sections are perpendicular to the longitudinal direction. As for both of the guide-inside storage parts, the configuration is the same as that of the Embodiment 2. In the present Embodiment 4, some bridge parts Brs are arranged on the way points of the five layered part T5 in the longitudinal direction. The cross sectional shape of this bridge part Br is the same as the cross sectional shape of the upper guide-inside storage part 2201U, and that of the lower guide-inside storage part 220D.

FIG. 6D is a cross sectional view of FIG. 6A taken along the line F-F, and shows a section of the five layered part T5 of the probe pin 220, where the section is perpendicular to the longitudinal direction. The cross sectional shape of this portion is the same as that of the Embodiment 1.

As mentioned above, in the five layered part T5, the low resistance member L, becomes higher in temperature than the high resistance member H. Not only due to the modification by buckling, but also due to the difference in the expansion rate, the amount of buckling is different in the low resistance member L and the high resistance member H. The low resistance member L, will have a larger buckling, and undergo a deflection. So, in the present Embodiment 4, some bridge parts Brs are arranged on the way points of the five layered part T5 according to the Embodiment 2, in the longitudinal direction. The bridge part Br may be provided at one point, and also a plurality of bridge parts Br may be provided.

In this Embodiment, the bridge part Br is provided, and the low resistance member L and the high resistance member H are adhered physically at the midway portion of the five layered part, along the entire length extending in the longitudinal direction. Thereby, even in a case where the low resistance member L has a large deflection, the high resistance member 11 can be prevented from contacting with the low resistance member at an unexpected part. In addition, damaging of the high resistance member H in the mechanical strength can be prevented.

According to the probe pin 420 and the probe card 100 in accordance with the Embodiment 4, the same effect as the Embodiment 1 will be produced, at the time of inspection of an electronic circuit which is formed on a semiconductor wafer W. Moreover, the amount of expansion in the low resistance member L of the five layered part T5 is distributed using the bridge part Br, and the buckling shape of the low resistance member L and the high resistance member H can be controlled. Then, it becomes possible to achieve a more reliable probe pin 320 and probe card 100.

Embodiment 5

Hereinafter, explanations will be made concerning the probe pin and the probe card in accordance with the Embodiment 5, focusing on portions which are different from the Embodiment 2.

Figure 7C:
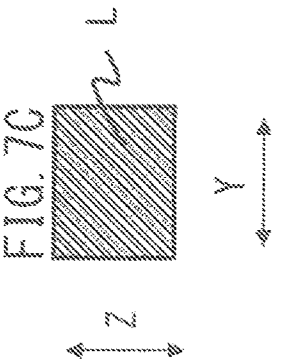
FIG. 7C is a cross sectional view of FIG. 71B taken along the line D-D.
Figure 7D:
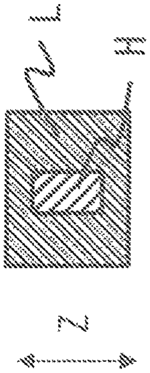
FIG. 7A is a diagram showing the configuration of the high resistance member of a probe pin in accordance with the Embodiment 5.
FIG. 7B is a diagram showing the probe pin in accordance with the Embodiment 5, where the probe pin is viewed from a buckling direction Z.
FIG. 7E is a cross sectional view of FIG. 713 taken along the line F-F.
Figure 7E:
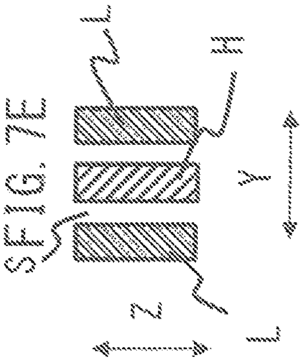
Figure 7B:
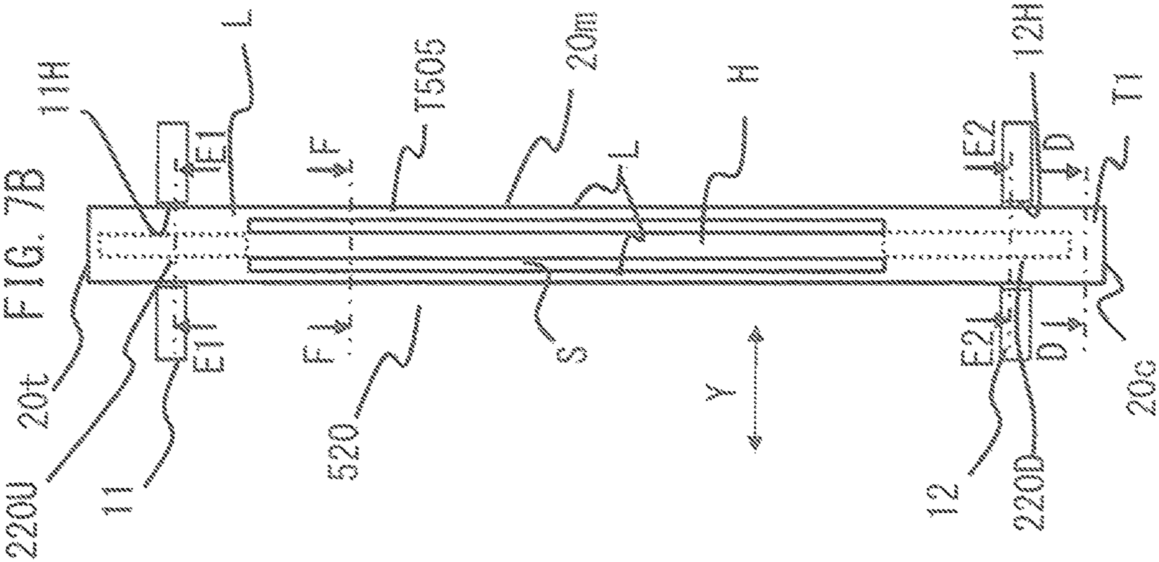
Figure 7A:
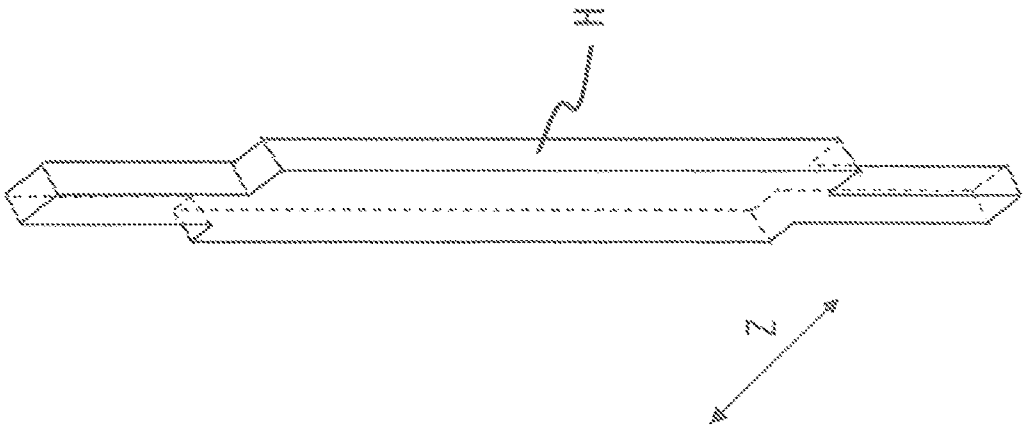

FIG. 7A is a diagram showing the configuration of the high resistance member of a probe pin 520.

FIG. 71B is a diagram of the probe pin 520 which is viewed from the buckling direction Z.

FIG. 7C is a cross sectional view of FIG. 7B taken along the line D-D.

FIG. 70 is a cross sectional view of FIG. 7, taken along the line E1-E1, and taken along the line E2-E2.

FIG. 7E is a cross sectional view of FIG. 7B taken along the line F-F.

The difference between the probe pin 220 described in the Embodiment 2 and the probe pin 520 according to the present Embodiment lies in the fact that the arrangement of the high resistance member H and the low resistance member L of the five layered part T505 is reversed from that of the Embodiment 2. That is, the high resistance member H of the probe pin 220 described in the Embodiment 2 becomes a low resistance member L in the present Embodiment 5, and in addition, the low resistance member L of the probe pin 220 described in the Embodiment 2 becomes a high resistance member H in the present Embodiment 5. Other configurations are entirely the same.

According to the probe pin 520 and the probe card 100 in accordance with the Embodiment 5, a low resistance member L and high resistance members H arranged at its both sides are adjoining via a slit S of the probe pin 20. Since those members are not aligned in the buckling direction Z, the low resistance member and the high resistance members do not come to contact with each other, at the time of inspection of an electronic circuit which is formed on a semiconductor wafer W, even though those members are different in the expansion rate. Therefore, the high heat of the low resistance member 1, does not conduct to the high resistance members H, and it becomes possible to achieve a probe pin and a probe card with enhanced heat dissipation and a high allowable current value.

Embodiment 6

Hereinafter, explanations will be made concerning the probe pin and the probe card according to the Embodiment 6, focusing on portions which are different from the Embodiment 1.

Figure 8B:
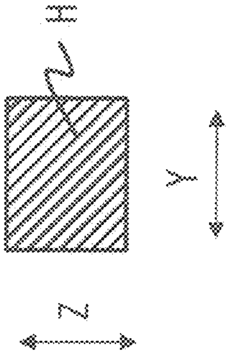
FIG. 8B is a cross sectional view of FIG. 8A taken along the line E1-E1, and taken along the line E2-E2.
Figure 8C:
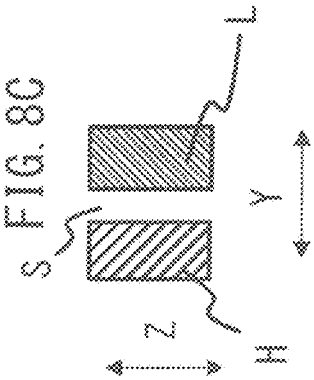
FIG. 8C is a cross sectional view of FIG. 8A taken along the line F-F.
Figure 8A:
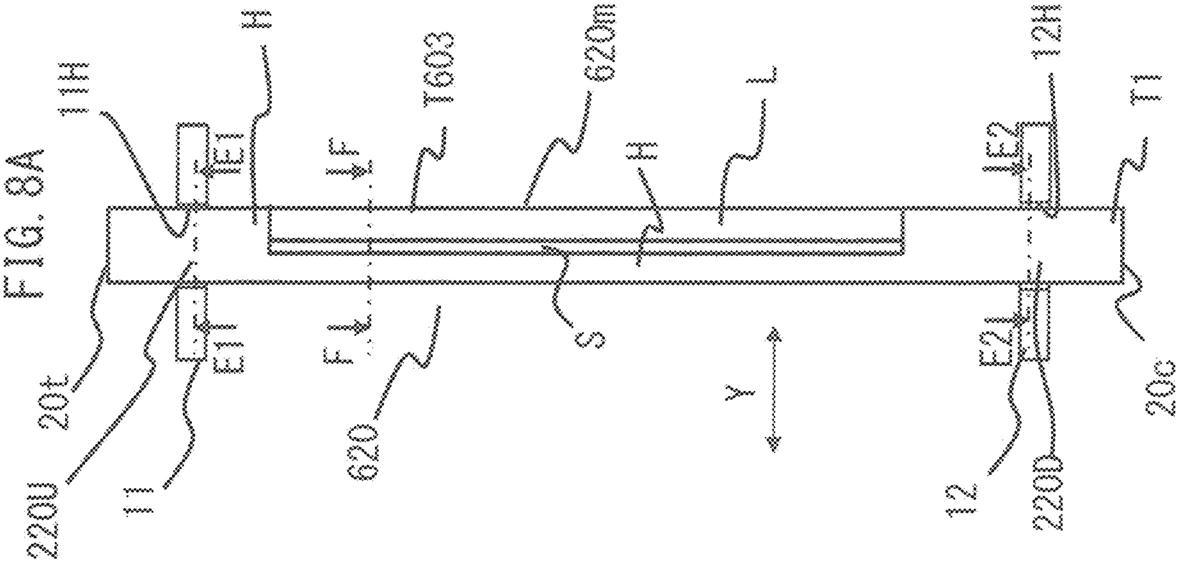
FIG. 8A is a diagram showing the probe pin in accordance with the Embodiment 6, where the probe pin is viewed from a buckling direction Z.

FIG. 8A is a diagram of a probe pin 620 which is viewed from the buckling direction Z.

FIG. 8B is a cross sectional view of FIG. 8B taken along the line E1-E1, and taken along the line E2-E2.

FIG. 8C is a cross sectional view of FIG. 8A taken along the line F-F.

In the Embodiment 1, the elastic deformation part 620*m* is a five layered part T5 including slits. In the present Embodiment 6, the elastic deformation part becomes a second three layered part T603 (multi layered part), where a high resistance member H, a slit S, and a low resistance member L are layered in this sequence, in the direction Y which is perpendicular to the buckling direction Z. And, the upward side and lower side of the second three layered part T603 and also the downward region are formed of the high resistance member H.

It is worth noticing that, as for the upper side and the lower side of the second three layered part T603, a two layered part can be employed, where a high resistance member H and a low resistance member L are layered in this sequence, in the direction Y which is perpendicular to the buckling direction Z.

According to the probe pin 620 and the probe card 100 in accordance with the Embodiment 6, a low resistance member L and high resistance members H are adjoining via a slit S of the probe pin 620, where the low resistance member L and the high resistance members are different in the expansion rate. Since those members are not aligned in the buckling direction Z, the low resistance member and the high resistance members do not come to contact with each other, at the time of inspection of an electronic circuit which is formed on a semiconductor wafer W. Therefore, the high heat of the low resistance member L does not conduct to the high resistance member H, and it becomes possible to achieve a probe pin and a probe card with enhanced heat dissipation and a high allowable current value.

Although the present disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present disclosure. For example, at least one of the constituent members may be modified, added, or eliminated. At least one of the constituent members mentioned in at least one of the preferred embodiments may be selected and combined with the constituent members mentioned in another preferred embodiment.

REFERENCE SIGNS LIST

100 Probe Card: 10 Frame: 11 Upper Guide: 12 Lower Guide: 11H, 12H Guide Hole: 13 Fixing Board: 13H Opening Part: 14 Wiring Substrate: 14P Probe Connection Pad: 20, 220, 320, 420, 520, 620 Probe Pin: 20*c* Contact Part: 20*m*, 620*m* Elastic Deformation Part: 20*t* Terminal Part: 20U, 220U Upper Guide-inside Storage Part: 20D, 220D Lower Guide-inside Storage Part: T1 Single Layered Part: T3 Three Layered Part: T603 Second Three Layered Part: T5, T505 Five Layered Part: Br Bridge Part: C Electrode: H High Resistance Member: L Low Resistance Member: S Slit: TC Tester Connection Electrode: W Semiconductor Wafer: Z Bucklin, Direction.

The invention claimed is:

1. A probe pin having a contact part at one end of a longitudinal direction, for contacting an electrode of a test object, and has a terminal part at the other end of the longitudinal direction, for contacting a circuit board, the probe pin comprising:

a low resistance member consisting of a first metal with a first conductivity, and a high resistance member consisting of a second metal with a second conductivity, the second metal having a resistivity higher than that of the low resistance member, wherein the probe pin has a multi layered part between the contact part and the terminal part, where the multi layered part is configured in an order of the high resistance member, a slit of air gap, and the low resistance member, in a first direction different from a buckling direction of the probe pin at the time of inspection of the test object, and the low resistance member and the high resistance member are arranged so as not to overlap with each other, when the multi layered part is viewed from the buckling direction.

2. The probe pin as claimed in claim 1, wherein the multi layered part is a five layered part consisting of five layers, which is configured in the order of the high resistance member, the slit, the low resistance member, the slit, and the high resistance member.

3. The probe pin as claimed in claim 2, wherein the probe pin has a first three layered part at one side of the five layered part in the longitudinal direction and a second three layered part at the other side of the five layered part in the longitudinal direction, each of the three layered parts formed of a low resistance member and two high resistance members, layered in the first direction, where the low resistance member is between the two high resistance members, wherein the low resistance member of the five layered part and the low resistance member of the three layered part are connected continuously in the longitudinal direction, the high resistance members of the five layered part and the high resistance members of the three layered part are each connected continuously in the longitudinal direction, and the contact part and the terminal part are constituted only of the high resistance member.

4. The probe pin as claimed in claim 3, comprising a first guide-inside storage part located between the terminal part and the five layered part, and a second guide-inside storage part located between the five layered part and the contact part, each of the guide-inside storage parts formed of a low resistance member and a high resistance member, wherein the circumference of an outer periphery of the low resistance member is entirely covered with the high resistance member.

5. The probe pin as claimed in claim 1, wherein the low resistance member of the multi layered part has two end faces in the buckling direction, and at least one of the end faces is equipped with a high resistance member.

6. The probe pin as claimed in claim 2, comprising a bridge part located between an upper end of the five layered part in the longitudinal direction and a lower end of the five layered part in the longitudinal direction, the bridge part having a low resistance member and a high resistance member, wherein the circumference of an outer periphery of the low resistance member is entirely covered with the high resistance member, and the low resistance member is adhered with the high resistance member.

7. The probe pin as claimed in claim 1, wherein the first direction is a direction which is perpendicular to the buckling direction.

8. The probe pin as claimed in claim 1, wherein the multi layered part is a second three layered part consisting of three layers, which is configured in the order of the high resistance member, the slit, and the low resistance member.

9. The probe pin as claimed in claim 1, wherein the multi layered part is a five layered part consisting of five layers, which is configured in the order of the low resistance member, the slit, the high resistance member, the slit, and the low resistance member.

10. A probe card comprising a plurality of probe pins as claimed in claim 1.

11. A probe card, comprising:

a plurality of probe pins as claimed in claim 4, and a first guide and a second guide, both having a plurality of guide holes, each for accepting the insertion of a probe pin and guiding the probe pin, wherein the first guide-inside storage part is inserted into the first guide hole, and the second guide-inside storage part is inserted into the second first guide hole.

12. The probe card as claimed in claim 11, wherein a first length of the first three layered part from the first guide-inside storage part to the five layered part, and a second length of the second three layered part from the second guide-inside storage part to the five layered part are 500 μm to 1000 μm.

* * * * *